United States Patent
Matsuda

(10) Patent No.: US 6,697,261 B2
(45) Date of Patent: Feb. 24, 2004

(54) MULTILEVELED PRINTED CIRCUIT BOARD UNIT INCLUDING SUBSTRATE INTERPOSED BETWEEN STACKED BUMPS

(75) Inventor: Shinji Matsuda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/749,505

(22) Filed: Dec. 28, 2000

(65) Prior Publication Data

US 2004/0017672 A1 Jan. 29, 2004

Related U.S. Application Data

(63) Continuation of application No. PCT/JP99/01263, filed on Mar. 16, 1999.

(30) Foreign Application Priority Data

Jul. 1, 1998 (JP) ............................................. 10-186044

(51) Int. Cl.⁷ ................................................. H05K 7/12
(52) U.S. Cl. ...................... 361/767; 361/807; 361/810; 361/779; 257/737; 257/738; 257/779; 174/253; 174/260
(58) Field of Search ................................. 361/767, 764, 361/790, 807, 810, 718, 735, 743, 748, 760, 779, 784, 768, 771, 783, 803; 174/253, 260, 257; 257/737, 738, 778, 772, 779

(56) References Cited

U.S. PATENT DOCUMENTS

| 4,783,722 | A |   | 11/1988 | Osaki et al. |         |
|-----------|---|---|---------|--------------|---------|
| 4,897,918 | A |   | 2/1990  | Osaka et al. |         |
| 5,477,933 | A | * | 12/1995 | Nguyen ....... | 174/262 |
| 5,641,113 | A |   | 6/1997  | Somaki et al. |        |
| 5,705,858 | A |   | 1/1998  | Tsukamoto    |         |
| 5,931,371 | A | * | 8/1999  | Pao et al. .... | 228/180.22 |
| 6,078,123 | A | * | 6/2000  | Tanaka et al. | 310/313 R |
| 6,177,728 | B1 | * | 1/2001  | Susko et al. | 257/737 |
| 6,225,206 | B1 | * | 5/2001  | Jimarez et al. | 438/616 |
| 6,333,563 | B1 | * | 12/2001 | Jackson et al. | 257/778 |

FOREIGN PATENT DOCUMENTS

| EP | 0 229 850 | 7/1987  |
|----|-----------|---------|
| JP | 62-18049  | 1/1987  |
| JP | 6-302650  | 10/1994 |
| JP | 8-17860   | 1/1996  |
| JP | 9-199644  | 7/1997  |
| JP | 9-214088  | 8/1997  |
| JP | 9-232376  | 9/1997  |
| JP | 9-321184  | 12/1997 |

\* cited by examiner

*Primary Examiner*—Randy Gibson
*Assistant Examiner*—Hung Bui
(74) *Attorney, Agent, or Firm*—Westerman, Hattori, Daniels & Adrian LLP

(57) ABSTRACT

Conductive or solder bumps are stacked between a mounted component such as a BGA device and a printed wiring substrate in a multileveled printed circuit board unit. An interposer or relay substrate is interposed between the adjacent stacked conductive bumps. The interposer substrate is made of a porous material. When any difference in the expansion is caused between the printed wiring substrate and the mounted component, one side of the interposer substrate receives a relatively smaller displacement force while the other side of the interposer substrate receives a relatively larger displacement force. A shearing stress is induced in the interposer substrate. Deformation of the porous material serves to absorb the shearing stress in the interposer substrate. The conductive bumps bonded on one side of the interposer substrate as well as the conductive bumps bonded on the other side of the interposer substrate may be relieved from a shearing stress. Accordingly, the durability of the conductive bumps can be improved. The conductive bumps are allowed to keep a stronger bonding in a longer duration.

4 Claims, 16 Drawing Sheets

FIG. 1A  FIG. 1B  FIG. 1C
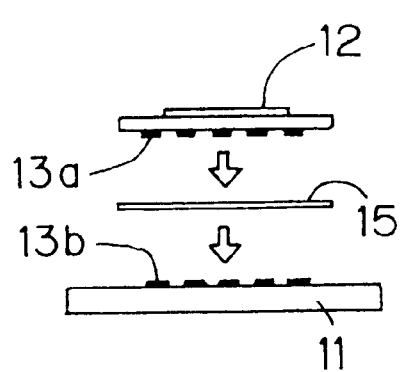
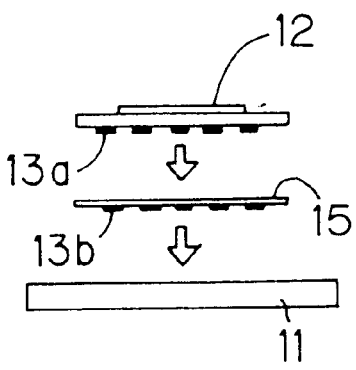
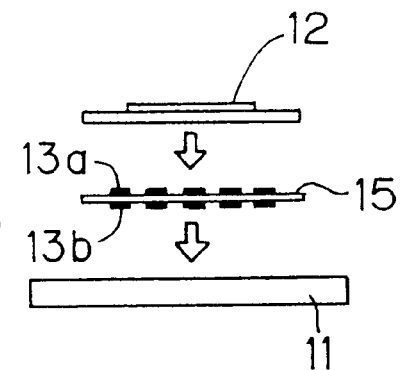
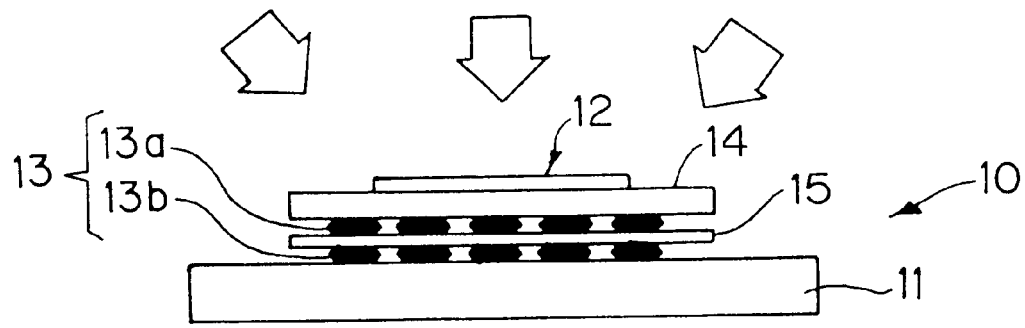
FIG. 1D

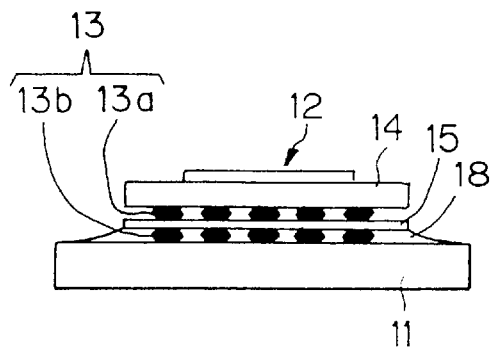
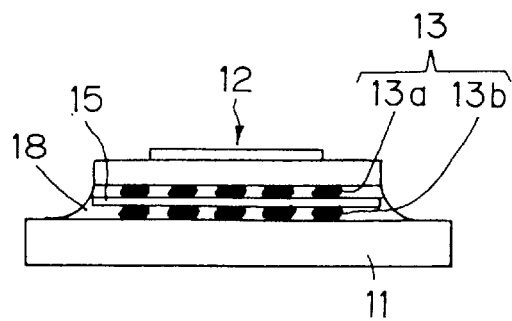
FIG.4A    FIG.4B
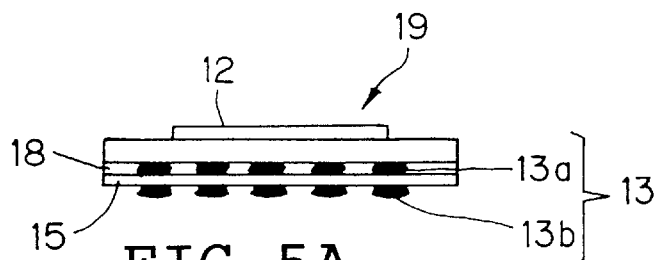
FIG.5A
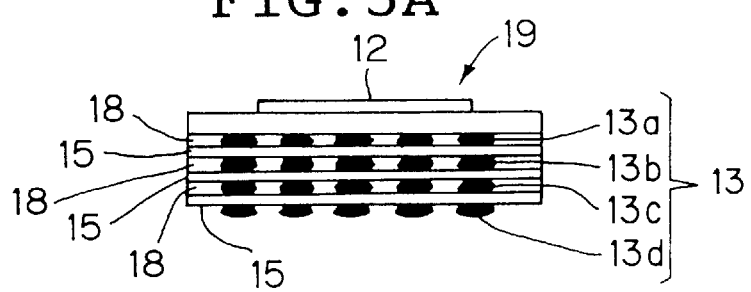
FIG.5B
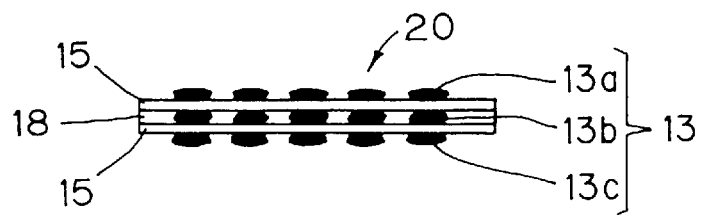
FIG.6

MULTILEVELED PRINTED CIRCUIT BOARD UNIT INCLUDING SUBSTRATE INTERPOSED BETWEEN STACKED BUMPS

This application is a continuation of international application PCT/JP99/01263, filed Mar. 16, 1999.

BACKGROUND OF THE INVENTION

1. Field of the Invention

The present invention relates to a printed circuit board unit including stacked solder or conductive bumps between a printed wiring substrate and a mounted component, and particularly, to an interposer or relay substrate interposed between the stacked conductive bumps.

2. Description of the Prior Art

A printed circuit board unit is well known to include a mounted component such as a ball grid array (BGA) device, for example. When the electric circuit generates heat in the printed circuit board unit, a heat or thermal stress is in general induced in the printed wiring substrate, made of a glass epoxy or polyimide resin, and the ceramic substrate of the BGA device. Since the printed wiring substrate made of resin and the ceramic substrate have different thermal expansion coefficients, the substrates usually suffer from a relative movement or shift along the surface of the printed wiring substrate due to the thermal expansion.

Such a relative movement between the printed wiring substrate made of resin and the ceramic substrate induces a shearing stress in solder bumps disposed between the printed wiring substrate and the ceramic substrate. The shearing stress may repeatedly be generated in the solder bumps in response to switching between on and off statuses of the electric circuit in the printed circuit board unit. The solder bumps may sometimes suffer from cracks when the shearing strain finally overcomes the strength of the solder bumps. The thus repeated and intermittent generation of the shearing stress is supposed to deteriorate the durability of the solder bumps.

It is conventionally known that a higher or taller solder bump leads to reduction in the shearing stress induced in the solder bump. A higher solder bump contributes to a broader distribution of the shearing stress, so that a smaller shearing stress can be defined within a horizontal cross-section of the solder bump. However, an increase in the height of a spherical solder bump or solder ball inevitably induces an increase in the width of the solder ball. A higher or taller solder ball in this manner is supposed to suffer from a smaller distribution density of the solder balls.

In view of the above-described disadvantage, it is proposed that solder bumps are vertically stacked on the printed wiring substrate below the mounted component. The stacked solder bumps are supposed to realize an increase in the height without increasing the width. In this proposal, the solder bumps and relay substrates are alternately stacked on one another on the printed wiring substrate. The relay substrate serves to connect the adjacent stacked solder bumps.

As disclosed in Japanese Patent Application Laid-open No. 09-214088, for example, it is proposed that the thermal expansion coefficient of the relay substrate is set at an intermediate level between the thermal expansion coefficients of the printed wiring substrate and the mounted component. In this case, a shearing stress is equally distributed over the stacked solder bumps. Japanese Patent Application Laid-open No. 62-18049 still proposes to interpose a relay substrate in the form of a film having a smaller Young's modulus between the stacked solder bumps. The relay substrate is supposed to absorb a larger shearing stress.

SUMMARY OF THE INVENTION

It is accordingly an object of the present invention to provide an interposer or a relay substrate for a multileveled printed circuit board unit capable of more efficiently absorbing a repetitive shearing stress induced in conductive bumps stacked between a printed wiring substrate and a mounted component, and a printed circuit board unit employing the same interposer.

It is another object of the present invention to provide an interposer or relay substrate capable of introducing additional functions in a multileveled printed circuit board unit.

According to a first aspect of the present invention, there is provided an interposer for a multileveled printed circuit board unit in which conductive bumps are stacked between a printed wiring substrate and a mounted component, comprising an interposer substrate made of a porous material interposed between stacked conductive bumps.

In the multileveled printed circuit board unit employing the interposer, when any difference in the expansion is caused between the printed wiring substrate and the mounted component, one side of the interposer substrate receives a relatively smaller displacement force while the other side of the interposer substrate receives a relatively larger displacement force. A shearing stress is induced in the interposer substrate. Deformation of the porous material serves to absorb the shearing stress in the interposer substrate. The conductive bumps bonded on one side of the interposer substrate as well as the conductive bumps bonded on the other side of the interposer substrate may be relieved from a shearing stress. Accordingly, the durability of the conductive bumps can be improved. The conductive bumps are allowed to keep a stronger bonding in a longer duration.

The porous material is preferably designed to define pores penetrating through the interposer substrate. The pore may be utilized to provide a via establishing an electric connection between the conductive bumps on the opposite sides. It is not necessary to bore the interposer substrate solely for the via. Production process of the interposer substrate can be facilitated.

The pore is designed as a slit located between adjacent ones of the conductive bumps arranged on an identical level. Even when one side of the interposer substrate receives a relatively smaller displacement force while the other side of the interposer substrate receives a relatively larger displacement force in the aforementioned manner, a shearing stress can be absorbed by deformation of the slit. In this case, the size of the slit at a central area of the interposer substrate is preferably set smaller than that of the slit located at a area remoter from the central area, since the planar displacement or shift gets larger at a location remoter from the center of the interposer substrate upon a thermal expansion of the printed wiring substrate and the mounted component.

According to a second aspect of the present invention, there is provided an interposer for a multileveled printed circuit board unit in which conductive bumps are stacked between a printed wiring substrate and a mounted component, comprising multilayered films made of different materials interposed between stacked conductive bumps.

It is possible to provide different characteristics at the opposite sides of the interposer substrate, respectively. For example, when the film contacting the mounted component may be made of a material having a thermal expansion coefficient identical to that of the mounted component, no shearing stress is induced in the conductive bumps between the mounted component and the film. On the other hand, when the film contacting the printed wiring substrate may be made of a material having a thermal expansion coefficient identical that of the printed wiring substrate, no shearing stress is likewise induced in the conductive bumps between the film and the printed wiring substrate. The material of the film contacting the mounted component may be selected from inorganic materials forming the substrate of the mounted component. The material of the film contacting the printed wiring substrate is selected from organic materials forming the printed wiring substrate. A relative sliding movement between the films may be accomplished by an adhesive layer interposed between the films. The adhesive layer may be made of an adhesive for coupling the films with each other.

According to a third aspect of the present invention, there is provided an interposer for a multileveled printed circuit board unit, comprising: a first conductive bump on a first level; and a second conductive bump on a second level stacked on the first conductive bump between a printed wiring substrate and a mounted component, said second conductive bump having a size different from that of the first conductive bump.

In general, the larger the size or diameter of a conductive bump gets, the larger the strength of the conductive bump can be obtained. The first and second conductive bumps are allowed to provide different strengths optimally required in the separate levels of the stacked conductive bumps, so that it is possible to minimize the size or diameter of the first and second conductive bumps. The overall height of the stacked solder bumps can thus be reduced, keeping a required strength. Alternatively, the first and second conductive bumps may be made of different materials, so that diffusion bonding of various strengths can be obtained between the conductive bumps and the interposer substrates as well as the other substrates, respectively.

According to a fourth aspect of the present invention, there is provided an interposer for a multileveled printed circuit board unit in which conductive bumps are stacked between a printed wiring substrate and a mounted component, comprising: an interposer substrate interposed between stacked conductive bumps; and a conductive wiring pattern formed on the interposer substrate so as to electrically connect at least the conductive bumps arranged on an identical level.

In the multileveled printed circuit board unit employing the interposer, the conductive wiring pattern on the interposer substrate serves to establish an alternative electric path for a disconnected wiring pattern on the printed wiring substrate and/or the mounted component. Also, the conductive wiring pattern may establish a modified electric path in place of a wiring pattern initially formed on the printed wiring substrate and/or the mounted component. In this case, two or more components may be mounted on the interposer substrate. In such a printed circuit board unit, the conductive wiring pattern on the interposer substrate may serve to establish an alternative electric path for a disconnected wiring pattern on the printed wiring substrate so as to electrically connect the mounted components to each other. Otherwise, the conductive wiring pattern may establish a modified electric path for a wiring pattern initially formed on the printed wiring substrate so as to connect the mounted components to each other.

According to a fifth aspect of the present invention, there is provided an interposer for a multileveled printed circuit board unit in which conductive bumps are stacked between a printed wiring substrate and a mounted component, comprising: an interposer substrate interposed between stacked conductive bumps; and a conductive pad disposed at a periphery of an area receiving the conductive bumps on the interposer substrate so as to receive a connecting wire.

In the multileveled printed circuit board unit employing the interposer, the connecting wire can simply be employed to establish an electric connection between the mounted components. In addition, since the conductive pads are allowed to receive the connecting wire at the periphery of the area receiving the conductive bumps on the interposer substrate, it is possible to easily fix the connecting wire to the target conductive pad without disassembling the multileveled printed circuit board unit.

According to a sixth aspect of the present invention, there is provided an interposer for a multileveled printed circuit board unit in which conductive bumps are stacked between a printed wiring substrate and a mounted component, comprising: an interposer substrate interposed between stacked conductive bumps; and a conductive pad disposed at a periphery of an area receiving the conductive bumps on the interposer substrate so as to receive a probe.

In the multileveled printed circuit board unit employing the interposer, it is possible to easily conduct an inspection for electric connection between the mounted component and the printed wiring substrate by simply contacting the tip ends of inspection probes with the target conductive pads. The inspection may serve to reveal a disconnection of the wiring pattern formed on the printed wiring substrate, a disconnection of the wiring pattern within the mounted component, and a disconnection at the respective conductive bumps. Moreover, since the conductive pads are allowed to receive the inspection probe at the periphery of the area receiving the conductive bumps on the interposer substrate, it is possible to easily contact the inspection probe with the target conductive pad without disassembling the multileveled printed circuit board unit.

According to a seventh aspect of the present invention, there is provided an interposer for a multileveled printed circuit board unit in which conductive bumps are stacked between a printed wiring substrate and a mounted component, comprising: an interposer substrate interposed between stacked conductive bumps; and a heat radiator attached to the interposer substrate.

In the multileveled printed circuit board unit employing the interposer, when the electric circuit operates to generate heat in the interposer substrate, heat radiation from the interposer substrate can be promoted through the heat radiator. The heat radiator may take the form of a fin, a thermal conductive pattern formed on the surface of the interposer substrate, and the like.

According to an eighth aspect of the present invention, there is provided an interposer for a multileveled printed circuit board unit in which conductive bumps are stacked between a printed wiring substrate and a mounted component, comprising: an interposer substrate interposed between stacked conductive bumps; and a standoff member standing on the interposer substrate so as to receive at least one of the printed wiring substrate and the mounted component at its tip end.

Employment of the interposer enables a method of mounting a component on a printed wiring substrate, comprising: preparing an interposer including a standoff member standing on an interposer substrate; preparing conductive bumps stacked between the printed wiring substrate and the component while allowing the interposer interposed between stacked conductive bumps; and reflowing the conductive bumps while the interposer and the component are urged against the printed wiring substrate. In this method, a pressure during a reflowing process enables leveling the height of the resulting conducive bumps, regulated by the height of the standoff member, on the identical level even if an irregularity can be found in the height of the conductive bumps on the identical level before ref lowing. The respective conductive bumps reliably achieve a bonding between the mounted component and interposer substrate as well as between the interposer substrate and the printed wiring substrate.

According to a ninth aspect of the present invention, there is provided an interposer for a multileveled printed circuit board unit in which conductive bumps are stacked between a printed wiring substrate and a mounted component, comprising: an interposer substrate interposed between stacked conductive bumps; and a guide member located on the interposer substrate at a predetermined location for adjustment of a relative position between the printed wiring substrate and the mounted component.

The guide member serves to prevent a displacement or slippage of the mounted component relative to the printed wiring substrate even when the conductive bumps are caused to melt during a reflowing process. The conductive bumps can reliably be bonded to the corresponding electrode pads on the mounted component, the interposer substrate and the printed wiring substrate, respectively.

The aforementioned interposers can be applied to a multileveled printed circuit board unit comprising: a printed wiring substrate: a component to be mounted on the printed wiring substrate; and conductive bumps stacked between the printed wiring substrate and the mounted component. It should be noted that the mounted component may include a ball grid array (BGA) device, a pin grid array (PGA) device, a flip chip, a chip for a multichip module (MCM), and the like.

BRIEF DESCRIPTION OF THE DRAWINGS

The above and other objects, features and advantages of the present invention will become apparent from the following description of the preferred embodiments in conjunction with the accompanying drawings, wherein:

FIGS. 1A to 1D are side views schematically illustrating the structure of a multileveled printed circuit board unit comprising solder bumps stacked one another between a printed wiring substrate and a mounted component, and a method of producing the same;

FIGS. 4A and 4B are side view illustrating the structure of a multileveled printed circuit board unit filled with a potting material;

FIGS. 5A and 5B are side views illustrating the structure of an assembly comprising a mounted component and an interposer substrate filled with a potting material;

FIG. 6 is a side view illustrating a joined structure of interposer substrates filled with a potting material;

DESCRIPTION OF THE PREFERRED EMBODIMENTS

Figure 2A:
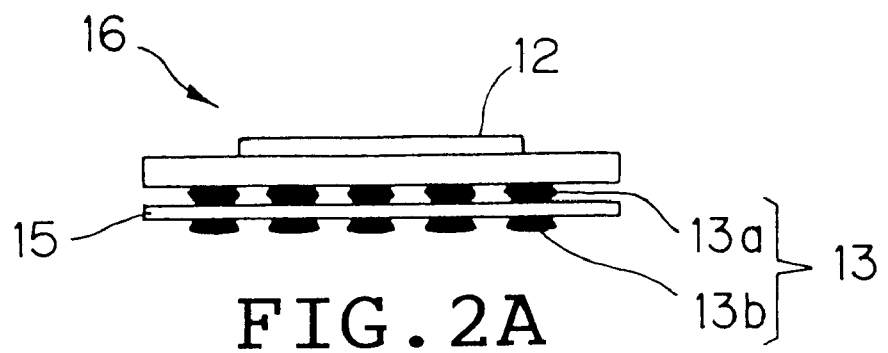
FIGS. 2A and 2B are side views illustrating the structure of an assembly comprising a mounted component and an interposer substrate.

FIG. 1D illustrates a multileveled printed circuit board unit. The printed circuit board unit 10 includes a printed wiring substrate 11 on which conductive or electrode pads and a conductive or wiring pattern for electrically connecting the electrode pads are printed. The printed wiring substrate 11 may be made of a resin material such as a glass epoxy resin, a polyimide resin, or the like.

A component 12 is mounted on the printed wiring substrate 11. The component 12 is fixed on the printed wiring substrate 11 with multileveled or stacked solder bumps 13 disposed between the printed wiring substrate 11 and the component 12. The component 12 can be represented by a ball grid array (BGA) device, a flip chip, and the like. The component 12 may include a ceramic substrate 14, for example.

An interposer or relay substrate 15 is interposed between the upper and lower solder bumps 13a, 13b of the stacked solder bumps 13. A via, not shown, may be formed in the interposer substrate 15 so as to electrically connect the upper and lower solder bumps 13a, 13b. When the solder bumps 13 are stacked over three or more levels one another, the interposer substrate 15 can be interposed between the respective pairs of upper and lower solder bumps 13.

Figure 2B:
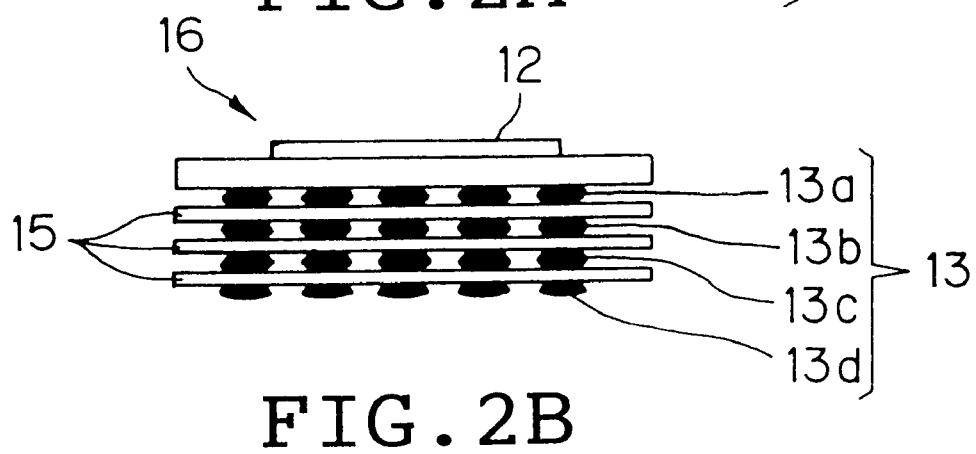
Figure 3:
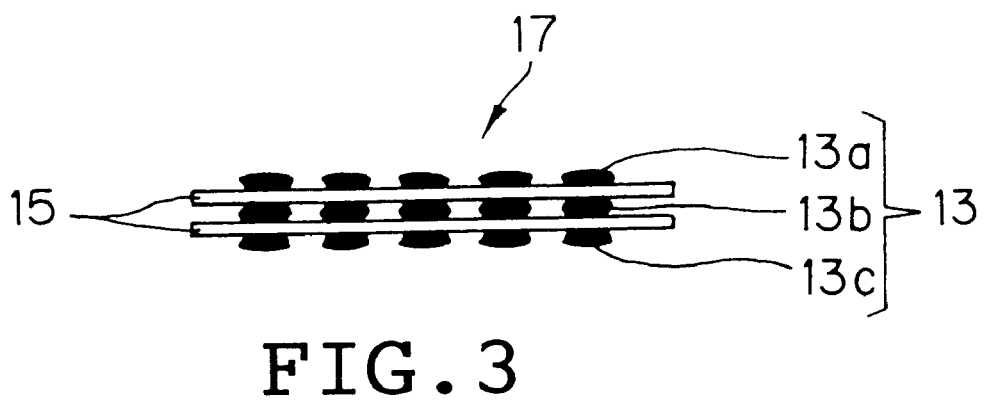
FIG. 3 is a side view illustrating a joined structure of interposer substrates.

As shown in FIG. 1A, when the component 12 is mounted on the printed wiring substrate 11, the upper and lower solder bumps 13a, 13b may be formed on the component 12 and the printed wiring substrate 11, respectively. After the interposer substrate 15 is interposed between the upper and lower solder bumps 13a, 13b, a reflowing process of the solder bumps 13a, 13b is conducted. As shown in FIG. 1B, the upper and lower bumps 13a, 13b may be attached to the component 12 and the interposer substrate 15, respectively, when the upper and lower solder bumps 13a, 13b are stacked between the component 12 and the printed wiring substrate 11. Furthermore, as shown in FIG. 1C, the upper and lower solder bumps 13a, 13b may be formed on opposite surfaces of the interposer substrate 15 when the stacked solder bumps 13 are disposed between the component 12 and the printed wiring substrate 11. When a reflowing process is conducted, an assembly of the component 16 and the interposer substrate 15 may previously be prepared, as shown in FIGS. 2A and 2B. Alternatively, a joined structure 17 of the interposer substrates 15 may be employed, as shown in FIG. 3.

A potting material 18 may be supplied to enclose the upper and/or lower solder bumps 13a, 13b. As shown in FIG. 4A, the potting material 18 may simply be introduced into a space between the printed wiring substrate 11 and the lowest interposer substrate 15. Alternatively, the potting material 18 may fill up an overall space between the printed wiring substrate 11 and the component 12 for completely enclosing the interposer substrate 15 as shown in FIG. 4B. An assembly of the component 19 and the interposer substrate 15, filled with the potting material 18, may previously be prepared, as shown in FIGS. 5A and 5B. Otherwise, a joined structure 20 of the interposer substrates 15, filled with the potting material 18, may be employed, as shown in FIG. 6.

Figure 7:
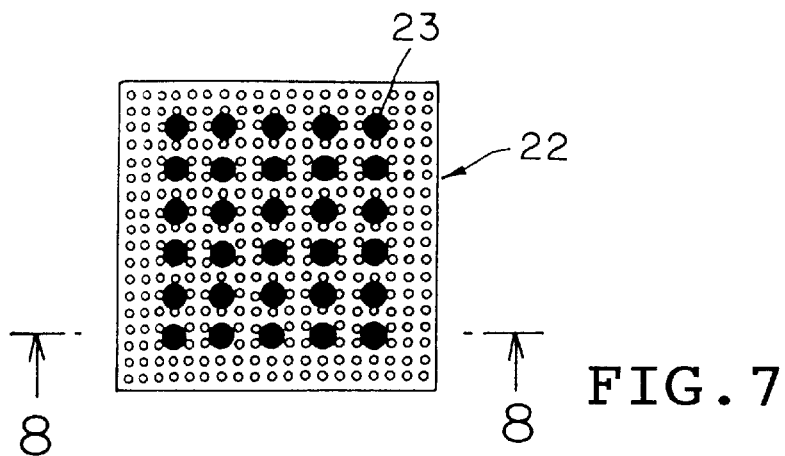
FIG. 7 is a plan view illustrating an interposer substrate according to a first embodiment of the present invention.
Figure 8:
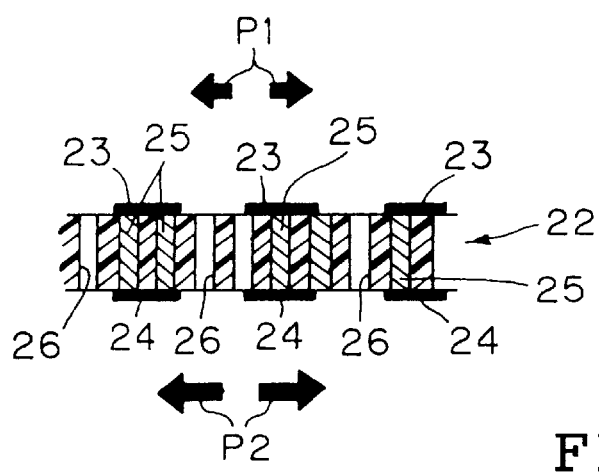
FIG. 8 is an enlarged partial sectional view taken along the line 8—8 in FIG. 7.

FIG. 7 illustrates an interposer or relay substrate 22 according to a first embodiment of the present invention. A plurality of conductive electrode pads 23 are arranged on the upper surface of the interposer substrate 22 in a grid array so as to correspond to respective conductive electrode pads on the component 12 to be mounted. As shown in FIG. 8, a plurality of conductive electrode pads 24 are also arranged on the lower surface of the interposer substrate 22 so as to correspond to the respective electrode pads 23 on the upper surface. The electrode pads 24 on the lower surface also correspond to respective conductive electrode pads on the printed wiring substrate 11. Vias 25 serve to establish electric connections between the electrode pads 23 on the upper surface and the corresponding electrode pads 24 on the lower surface.

The interposer substrate 22 is made of a porous material sheet or film defining tiny pores 26. The respective pores 26 are designed to penetrate through the interposer substrate 22 in the direction of its thickness. The electrode pads 23 on the upper surface suffer from a relatively smaller displacement or shift P1 along the upper surface of the interposer substrate 22 when an expansion is induced in the component 12. On the other hand, the electrode pads 24 on the lower surface suffer from a relatively larger displacement or shift P2 along the lower surface of the interposer substrate 22 when an expansion is induced in the printed wiring substrate 11. A shearing stress is thus induced between the electrode pads 23, 24 in the interposer substrate 22. The pores 26 are allowed to deform absorbing the shearing stress in the porous material sheet. Accordingly, less shearing stress is induced in the solder bumps 13a, 13b bonded on the respective electrode pads 23, 24. Moreover, since the tiny pores 26 can selectively be employed to establish the vias 25, it is not necessary to bore the interposer substrate 22 solely for the vias 25. Production process of the interposer substrate 22 can be facilitated. Here, the porous material sheet is preferably made of a high elastic material. The porous material sheet can be formed by utilizing a foamed agent introduced in a resin material in molding.

Figure 9:
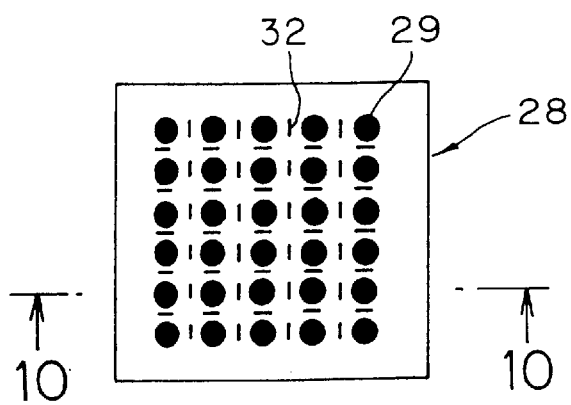
FIG. 9 is a plan view illustrating an interposer substrate according to a second embodiment of the present invention.
Figure 10:
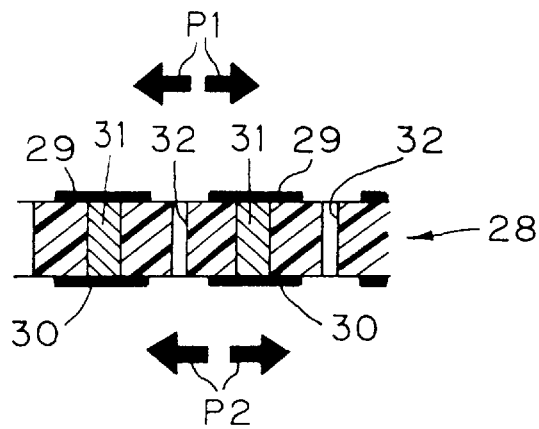
FIG. 10 is an enlarged partial sectional view taken along the line 10—10 in FIG. 9.

FIGS. 9 and 10 illustrate an interposer or relay substrate 28 according to a second embodiment of the present invention. A plurality of conductive electrode pads 29, 30 are likewise arranged on the upper and lower surfaces of the interposer substrate 28, respectively, in the same manner as the aforementioned first embodiment. Vias 31 serve to establish electric connections between the electrode pads 29 on the upper surface and the corresponding electrode pads 30 on the lower surface.

Figure 11:
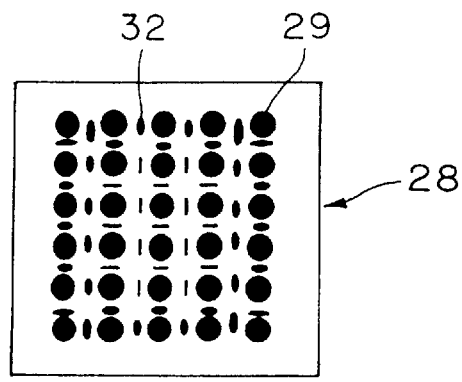
FIG. 11 is a plan view illustrating a modification of the interposer substrate according to the second embodiment of the present invention.

The interposer substrate 28 is designed to define slits 32 penetrating through the interposer substrate 28 in the direction of its thickness. The respective slits 32 are located between the adjacent ones of the electrode pads 29, 30 arranged on the identical level. When the electrode pads 29 suffer from a relatively smaller displacement or shift P1 while the electrode pads 30 suffer from a relatively larger displacement or shift P2 in the aforementioned manner, the respective slits 32 are allowed to deform so as to absorb a shearing stress induced between the electrode pads 29, 30 in the interposer substrate 28. Accordingly, less shearing stress is induced in the solder bumps 13a, 13b bonded on the respective electrode pads 29, 30. In particular, the size of the slits 32 at the central area of the interposer substrate 28 is preferably set smaller than that of the slits 32 located at the area remoter from the central area, as shown in FIG. 11, since the planar displacement or shift P1, P2 gets larger at a location remoter from the center of the interposer substrate 28 upon a thermal expansion of the printed wiring substrate 11 and the component 12.

Figure 12:
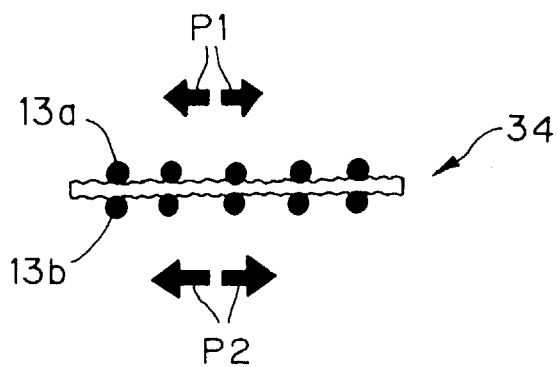
FIG. 12 is a side view illustrating an interposer substrate according to a third embodiment of the present invention.

FIG. 12 illustrates an interposer or relay substrate 34 according to a third embodiment of the present invention. In this embodiment, the interposer substrate 34 is shaped to have undulation in the cross-section. The interposer substrate 34 is allowed to absorb a shearing stress caused by the planar displacement or shift P1, P2 without utilizing the aforementioned pores 26 and the slits 32. Accordingly, less shearing stress is induced in the solder bumps 13a, 13b bonded on the upper and lower surfaces of the interposer substrate 34.

Figure 13:
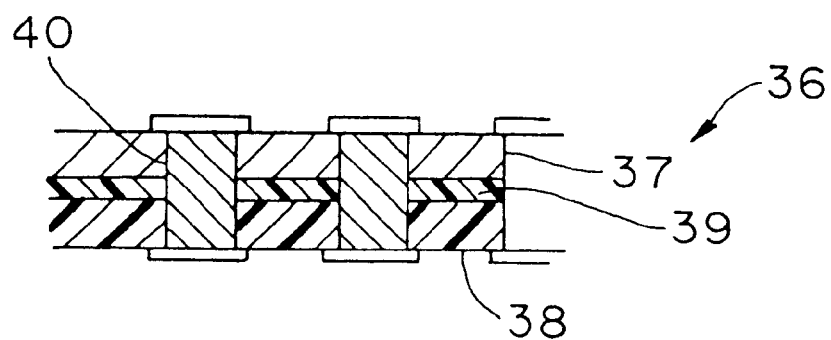
FIG. 13 is an enlarged partial sectional view illustrating the structure of an interposer substrate according to a fourth embodiment of the present invention.

FIG. 13 illustrates an interposer or relay substrate 36 according to a fourth embodiment of the present invention. In this embodiment, the interposer substrate 36 includes a multilayered films comprising a first film 37 and a second film 38 superposed on the first film 37. The first film 37 is made of an inorganic material such as a ceramic material in the same manner as the ceramic substrate 14 of the component 12. The second film 38 is made of an organic material such as a glass epoxy or polyimide resin in the same manner as the printed wiring substrate 11. An adhesive layer 39 made of an adhesive, for example, is interposed between the first and second films 37, 38 so as to adhere the first and second films 37, 38 to each other.

Figure 14:
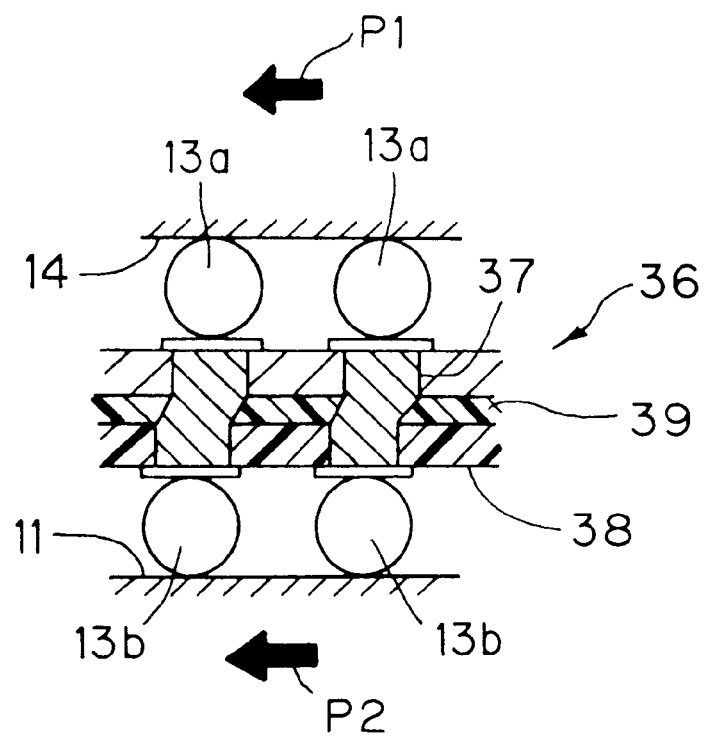
FIG. 14 is a sectional view illustrating the behavior of the interposer substrate.

Assume that the ceramic substrate 14 and the printed wiring substrate 11 suffer from a thermal expansion, respectively. As shown in FIG. 14, the first film 37 is supposed to expand in unison with the expansion of the ceramic substrate 14 of the component 12 while the second film 38 is supposed to expand in unison with the expansion of the printed wiring substrate 11 in this case. The adhesive layer 39 serves to allow a sliding movement between the first and second films 37, 38. A natural thermal expansion can be accepted in the first and second films 37, 38, respectively, irrespective of the difference in the thermal expansion coefficients. No shearing stress is induced in the solder bumps 13a, 13b. The stacked solder bumps 13a, 13b with the interposer substrate 36 interposed therebetween can absorb a remarkable shearing stress. The levels of the stacked solder bumps 13 can accordingly be reduced. In this embodiment, vias 40 are preferably made of an elastic and electrically conductive material, since the aforementioned sliding movement cannot be achieved between the first and second films 37, 38 without deformation of the vias 40.

Figure 15:
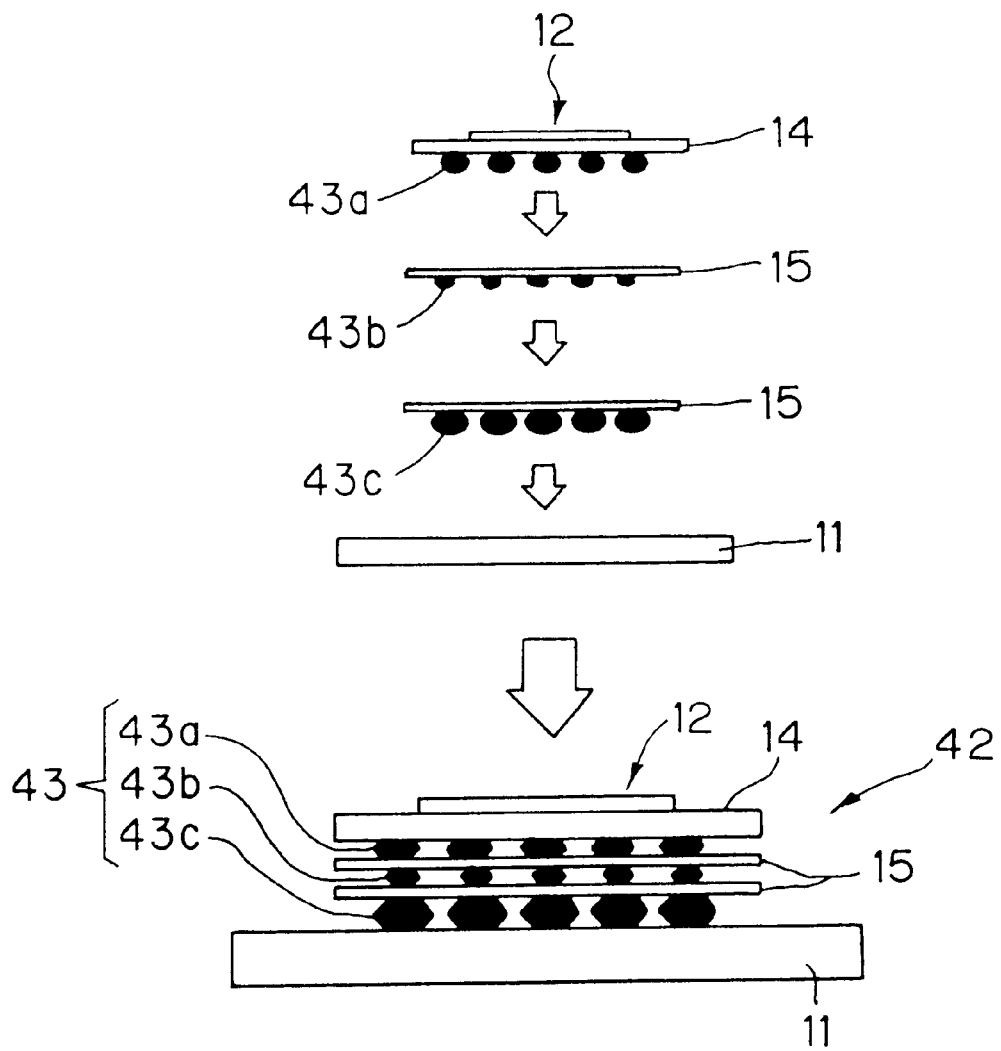
FIG. 15 is a side view schematically illustrating the structure of a multileveled printed circuit board unit comprising an interposer substrate according to a fifth embodiment of the present invention, and a method of producing the same.

FIG. 15 illustrates a multileveled printed circuit board unit 42 employing an interposer or relay substrate according to a fifth embodiment of the present invention. The printed circuit board unit 42 includes solder bumps 43a, 43b, 43c of different sizes or diameters stacked one another between the component 12 and the printed wiring substrate 11. The interposer substrate 15 is interposed between the respective pairs of upper and lower solder bumps 43a, 43b, 43c. The solder bumps 43a, 43b, 43c on the identical level may have the same diameter, respectively. In general, the larger the size or diameter of a solder bump gets, the larger the strength of the solder bump can be obtained. Even when different strengths are required in the separate levels of the stacked solder bumps 43, it is possible to minimize the size or diameter of the solder bumps 43a, 43b, 43c. The overall height of the stacked solder bumps 43 can thus be reduced, keeping a required strength. Like reference numerals are attached to the structures accomplishing the function and effect identical to that of the structure included in the aforementioned embodiments. Detailed descriptions have been omitted.

Figure 16:
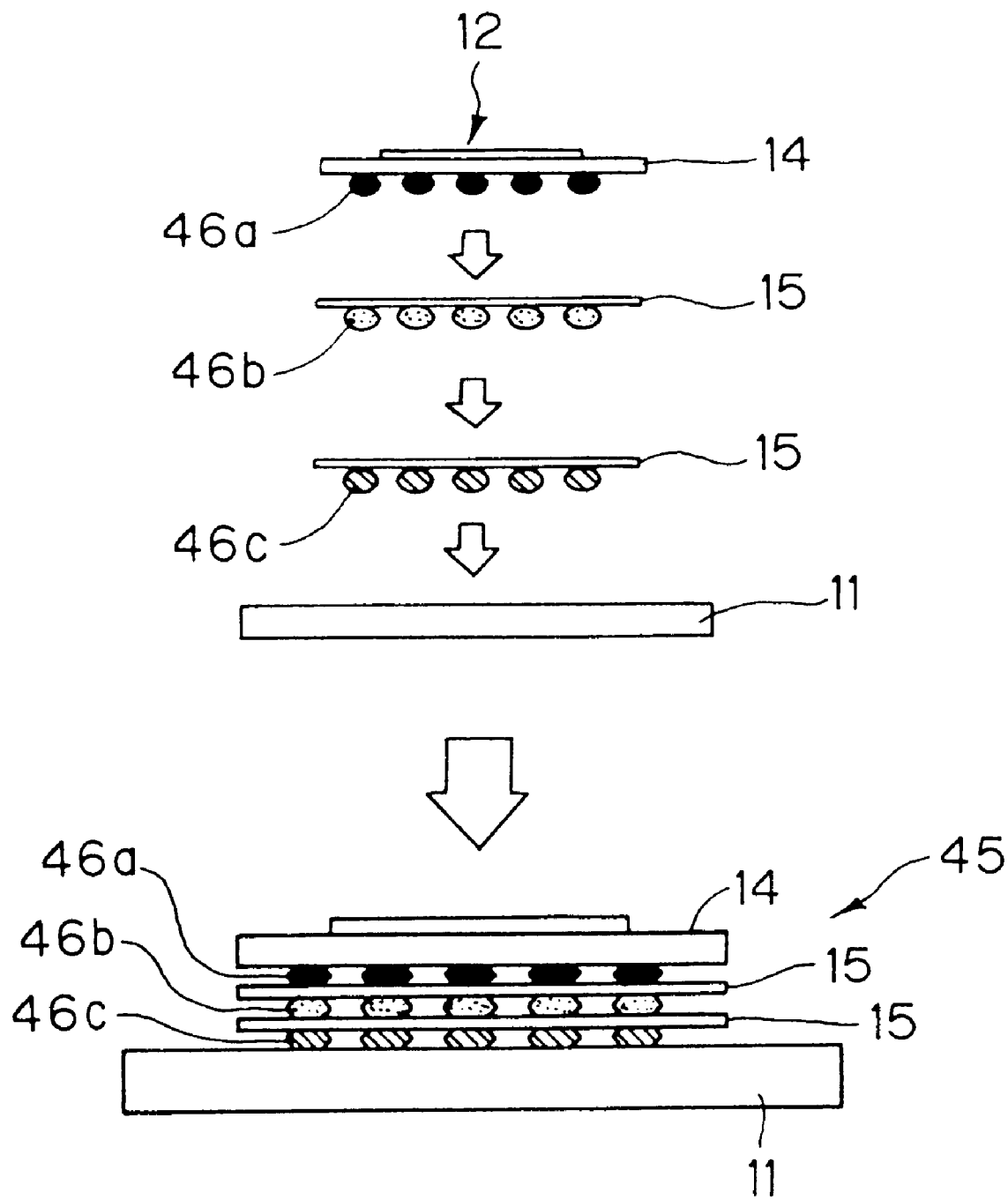
FIG. 16 is a side view schematically illustrating the structure of a multileveled printed circuit board unit comprising an interposer substrate according to a sixth embodiment of the present invention, and a method of producing the same.

FIG. 16 illustrates a multileveled printed circuit board unit 45 employing an interposer or relay substrate according to a sixth embodiment of the present invention. In this embodiment, solder bumps 46a, 46b, 46c are made of different materials, so that diffusion bonding of various strengths can be obtained between the solder bumps 46a, 46b, 46c and the interposer substrates 15 as well as the other substrates, respectively. Even when the solder bumps 46a, 46b, 46c are designed to have the same size or diameter, it is possible to separately set the strength of the solder bumps 46a, 46b, 46c of the respective levels. In general, a material of the solder bump is selected from Pb-Sn materials in a mounted component such as a BGA device. On the other hand, a leadless cream solder is often printed on a printed wiring substrate. If such a BGA device is directly mounted on the printed wiring substrate, the Pb-Sn solder may be mixed with the leadless solder. Such mixture of the Pb-Sn material and the leadless solder sometimes serves to reduce a bonding strength. If the interposer substrate 15 is interposed between the component 12 and the printed wiring substrate 11, it is possible to prevent the Pb-Sn solder bumps 46a on the component 12 from being mixed with the leadless solder bumps 46b, 46c on the interposer substrate 15 and the printed wiring substrate 11. Moreover, employment of the interposer substrate 15 allows the treatment of the cream solder having a relatively lower melting point to be conducted separately from the treatment of the solder bumps 46a having a relatively higher melting point. Specifically, after the component 12 has been mounted on the interposer substrate 15 in the atmosphere of a higher temperature, a reflowing process can be effected to mount the interposer substrate 15 on the printed wiring board 11 at a lower temperature.

Figure 17A:
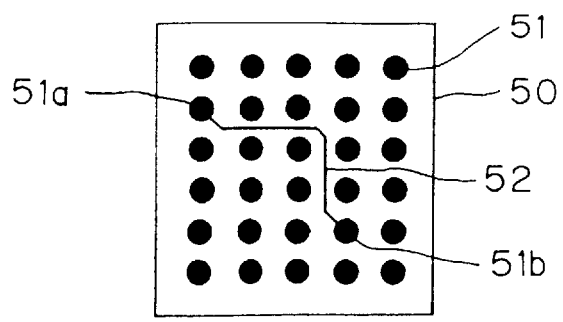
FIGS. 17A and 17B is plan and side views illustrating the structure of a multileveled printed circuit board unit comprising an interposer substrate according to a seventh embodiment of the present invention.
Figure 17B:
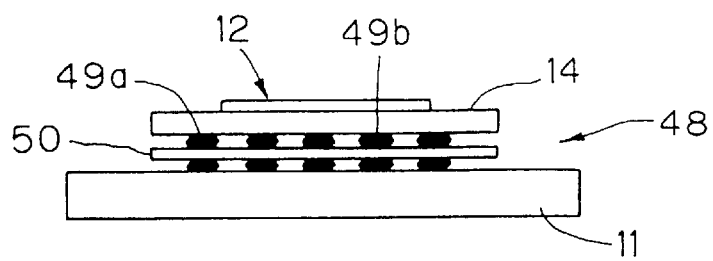

FIGS. 17A and 17B illustrate a multileveled printed circuit board unit 48 employing an interposer or relay substrate 50 according to a seventh embodiment of the present invention. A conductive wiring pattern is formed on the interposer substrate 50 so as to establish an electric connection at least between conductive or solder bumps 49a, 49b on the identical level in the printed circuit board unit 48. As is apparent from FIG. 17A, a plurality of conductive electrode pads 51 are arranged on the upper surface of the interposer substrate 50 in a grid array. The conductive wiring pattern 52 is formed on the upper surface of the interposer substrate 50 so as to connect the electrode pad 51a corresponding to the solder bump 49a and the electrode pad 51b corresponding to the solder bump 49b. In this printed circuit board unit 48, the conductive wiring pattern 52 on the interposer substrate 50 may serve to establish an alternative electric path for a disconnected wiring pattern on the printed wiring substrate 11 and/or the component 12. Also, the conductive wiring pattern 52 may establish a modified electric path in place of a wiring pattern initially formed on the printed wiring substrate 11 and/or the component 12. Like reference numerals are attached to the structures accomplishing the function and effect identical to that of the structure included in the aforementioned embodiments. Detailed descriptions have been omitted.

Figure 18A:
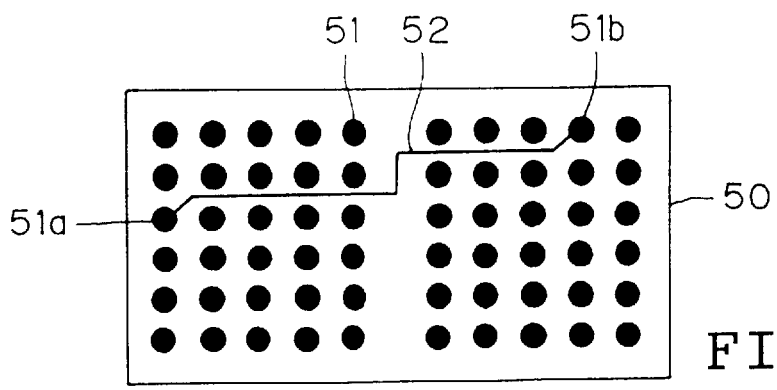
FIGS. 18A and 18B are plan and side views illustrating a modified example of a multileveled printed circuit board unit employing the interposer substrate according to the seventh embodiment.
Figure 18B:
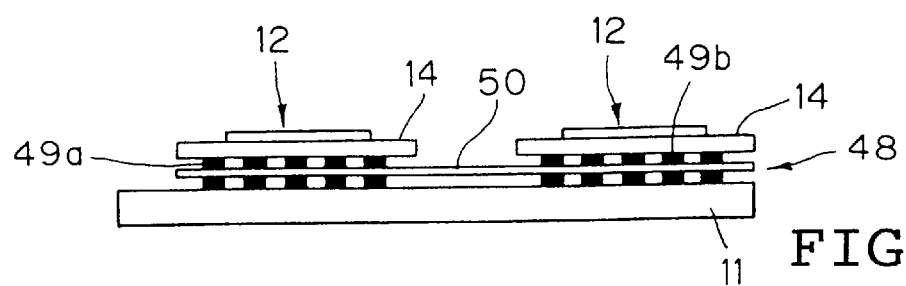

As shown in FIGS. 18A and 18B, two or more components 12 may be mounted on the interposer substrate 50. In such a printed circuit board unit 48, the conductive wiring pattern 52 on the interposer substrate 50 may serve to establish an alternative electric path for a disconnected wiring pattern on the printed wiring substrate 11 so as to electrically connect the components 12 to each other. Otherwise, the conductive wiring pattern 52 may establish a modified electric path for a wiring pattern initially formed on the printed wiring substrate 11 so as to connect the components 12 to each other.

Figure 19:
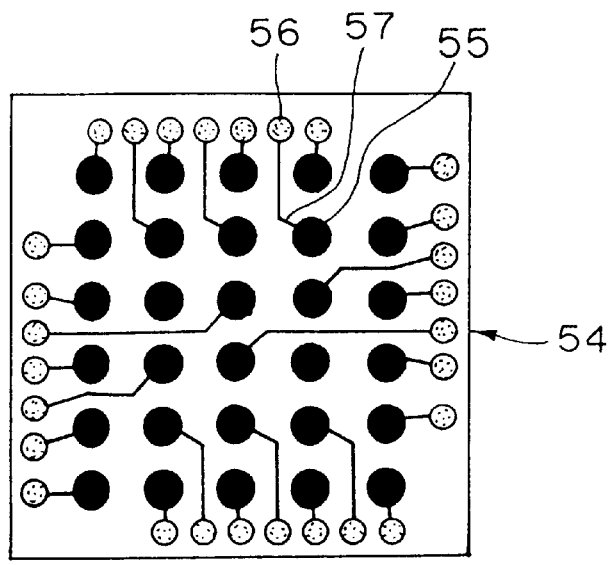
FIG. 19 is a plan view illustrating an interposer substrate according to an eighth embodiment of the present invention.

FIG. 19 illustrates an interposer or relay substrate 54 according to an eighth embodiment of the present invention. A plurality of conductive electrode pads 55 are arranged on the upper surface of the interposer substrate 54 in a grid array in correspondence with electrode pads on the component 12. Likewise, conductive pads 56 are arranged on the upper surface of the interposer substrate 54 at a periphery of an area receiving the conductive electrode pads 55 so as to receive a connecting wire. A conductive wiring pattern 57 is designed to establish an electric connection between the specific electrode pads 55 and the conductive pads 56 in a one-to-one correspondence.

Figure 20A:
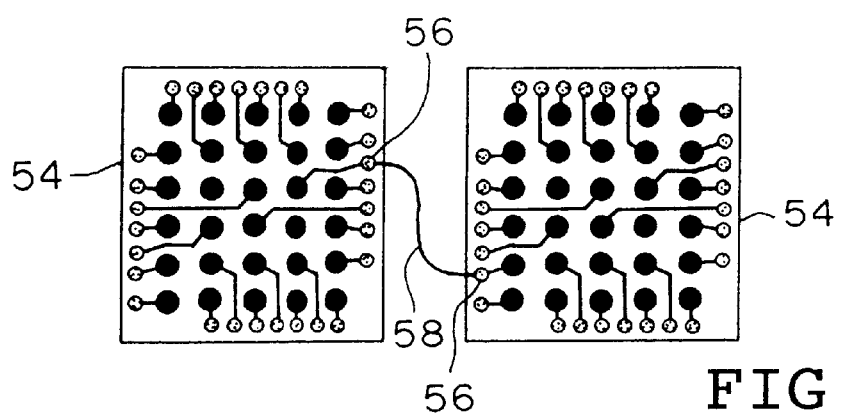
FIGS. 20A and 20B are plan and side views of the multileveled printed circuit board unit for illustrating the function of the interposer substrate according to the eighth embodiment.
Figure 20B:
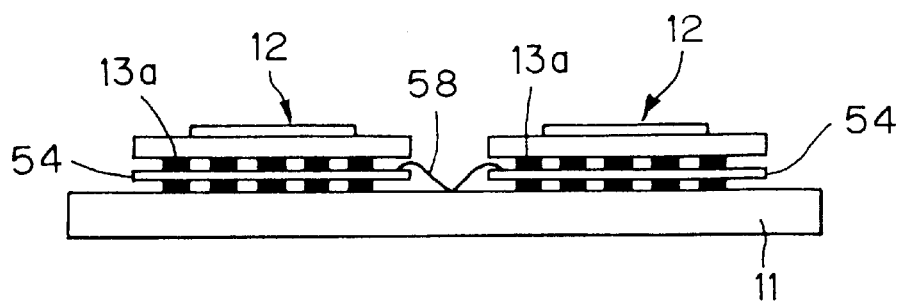

As shown in FIGS. 20A and 20B, the connecting wire 58 can be employed to establish an electric connection between the components 12 mounted on the printed wiring substrate 11. For example, the interposer substrate 48 shown in FIGS. 18A and 18B may be employed to likewise connect the components 12 to each other on the printed wiring substrate 11. However, if the components 12 are spaced apart from each other on the printed wiring substrate 11, the interposer substrate 48 should be made larger enough. On the other hand, the connecting wire 58 alone is simply utilized to connect the components 12 to each other without unnecessarily enlarging the size of the interposer substrate 48 in this embodiment. Moreover, since the conductive pads 56 are allowed to receive the connecting wire 58 at the periphery of the area receiving the solder bumps 13a on the interposer substrate 54, it is possible to easily fix the connecting wire 58 to the target conductive pad 56 without disassembling the multileveled printed circuit board unit.

Figure 21:
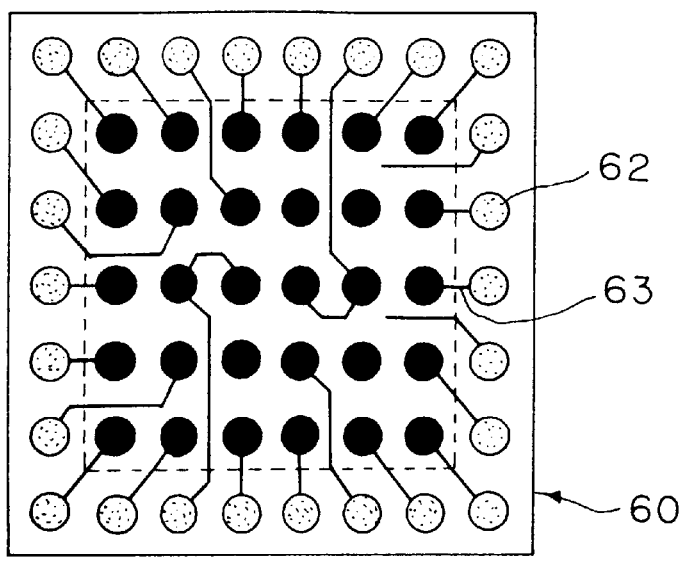
FIG. 21 is a plan view illustrating an interposer substrate according to a ninth embodiment of the present invention.

FIG. 21 illustrates an interposer or relay substrate 60 according to a ninth embodiment of the present invention. A plurality of conductive electrode pads 61 are arranged on the upper surface of the interposer substrate 60 in a grid array in correspondence with respective electrode pads on the component 12. Likewise, conductive pads 62 are arranged on the upper surface of the interposer substrate 60 at a periphery of an area receiving the conductive electrode pads 61 so as to receive a probe. A conductive wiring pattern 63 is designed to establish an electric connection between the specific electrode pads 61 and the conductive pads 62 in a one-to-one correspondence.

Figure 22A:
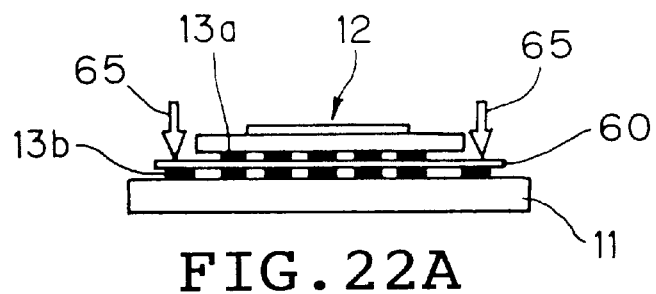
FIGS. 22A and 22B are plan and side views of the multileveled printed circuit board unit for illustrating the function of the interposer substrate according to the ninth embodiment.
Figure 22B:
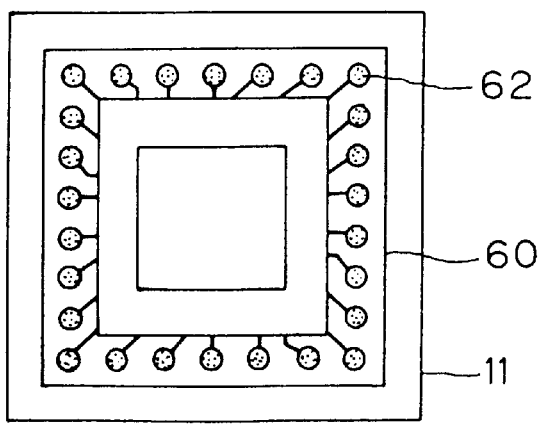

As shown in FIGS. 22A and 22B, it is possible to easily conduct an inspection for electric connection between the component 12 and the printed wiring substrate 11 by simply contacting the tip ends of inspection probes 65 with the target conductive pads 62. The inspection may serve to reveal a disconnection of the wiring pattern formed on the printed wiring substrate 11, a disconnection of the wiring pattern within the component 12, and a disconnection at the respective solder bumps 13a, 13b. Moreover, since the conductive pads 62 are allowed to receive the inspection probe 65 at the periphery of the area receiving the solder bumps 13a on the interposer substrate 60, it is possible to easily contact the inspection probe 65 with the target conductive pad 62 without disassembling the multileveled printed circuit board unit.

Figure 23A:
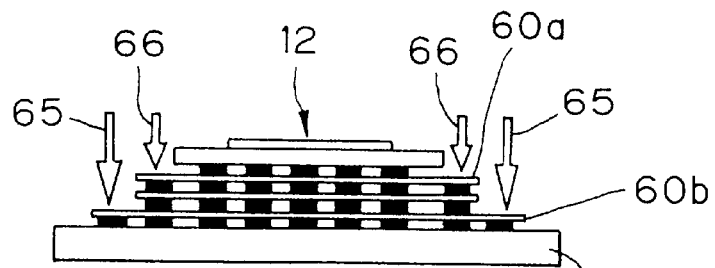
FIGS. 23A and 23B are plan and side views of the multileveled printed circuit board unit for illustrating the function of the interposer substrate according to the ninth embodiment.
Figure 23B:
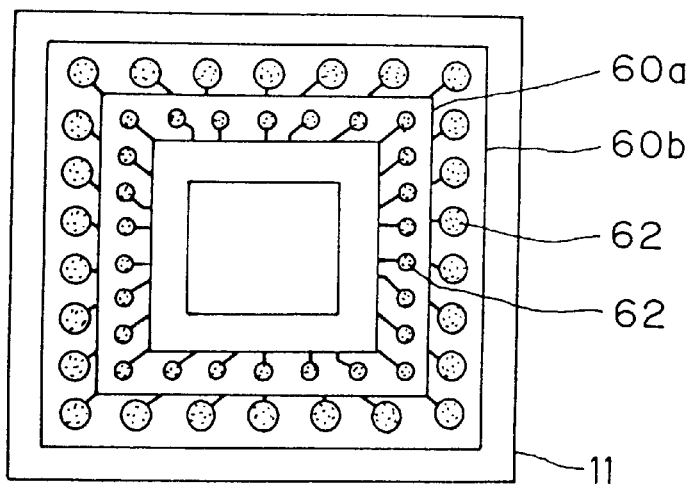

In addition, the conductive pads 62 may be located on the interposer substrates 60a, 60b of various levels, as shown in FIGS. 23A and 23B. In this case, an upper interposer substrate 60a is preferably made smaller than a lower interposer substrate 60b. With this arrangement, the inspection probes 65, 66 are always allowed to approach the conductive pads 62 in a vertical direction.

Figure 24:
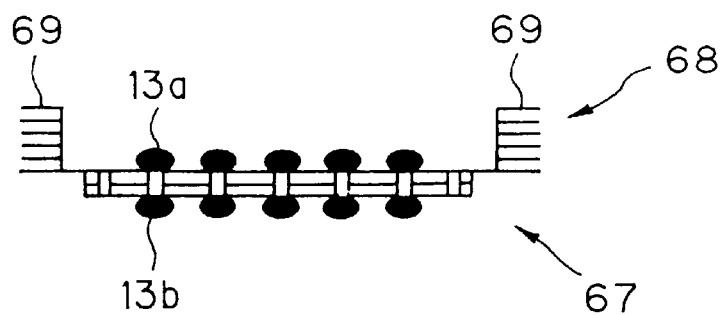
FIG. 24 is a side view illustrating an interposer substrate according to tenth embodiment of the present invention.

FIG. 24 illustrates an interposer or relay substrate 67 according to a tenth embodiment of the present invention. A heat radiator 68 is attached to the interposer substrate 67. The heat radiator 68 comprises cooling fins 69 located at the periphery of the area receiving the solder bumps 13a, 13b. When the electric circuit operates to generate heat in the interposer substrate 67, heat radiation from the interposer substrate 67 can be promoted through the cooling fins 69. The cooling fins 69 are preferably made of a high thermal conductivity material such as a metal.

Figure 25:
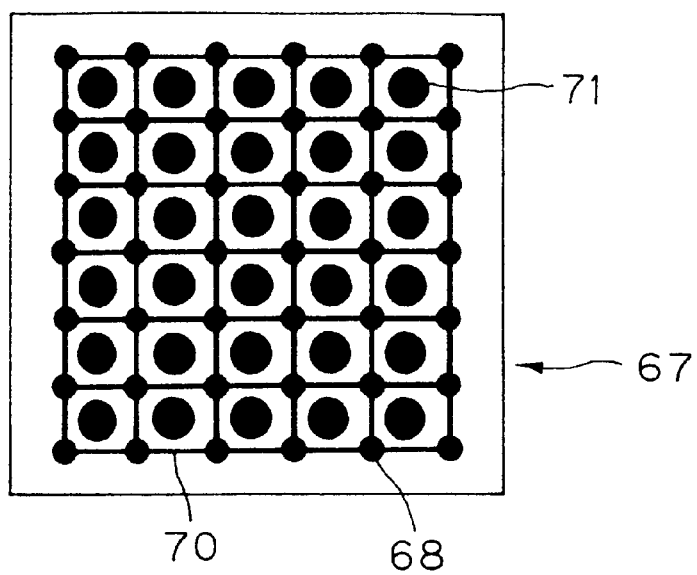
FIG. 25 is a plan view illustrating a modified example of the interposer substrate according to the tenth embodiment.

As shown in FIG. 25, the heat radiator 68 may comprise a thermal conductive pattern 70 formed on the surface of the interposer substrate 67. The thermal conductive pattern 70 may be shaped in a grid so as to be located off the conductive electrode pads 71. The thermal conductive pattern 70 is preferably made of a high thermal conductivity material such as a metal. Additionally, the heat radiator 68 may comprise not only the thermal conductive pattern 70 but also the aforementioned cooling fins 69. In this case, the cooling fins 69 are preferably connected to the thermal conductive pattern 70.

Figure 26:
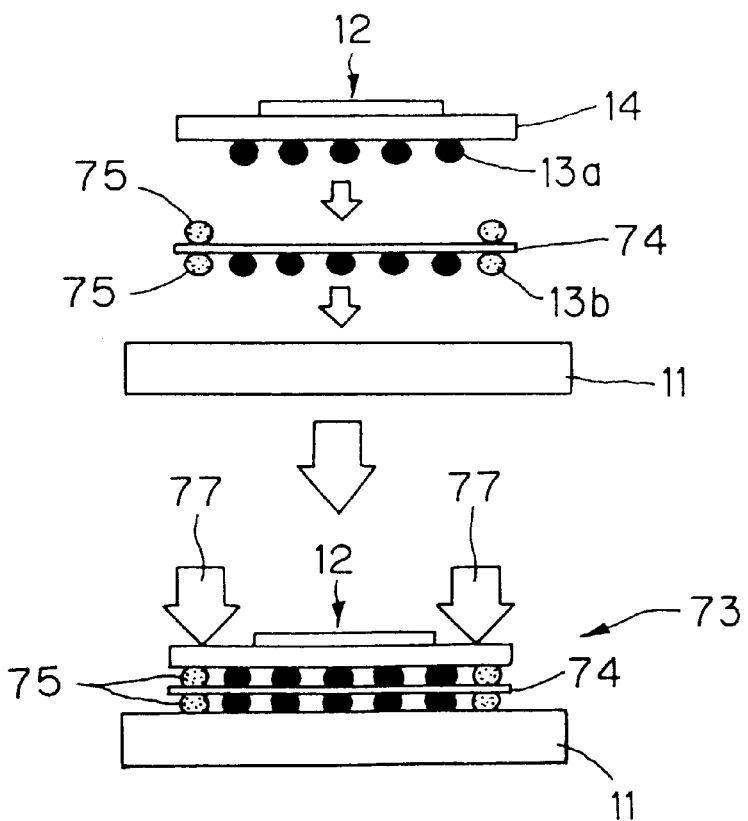
FIG. 26 is a side view schematically illustrating the structure of a multileveled printed circuit board unit comprising an interposer substrate according to an eleventh embodiment of the present invention, and a method of producing the same.

FIG. 26 illustrates a multileveled printed circuit board unit 73 employing an interposer or relay substrate according to an eleventh embodiment of the present invention. When the printed circuit board unit 73 is to be fabricated, the stacked solder bumps 13 are first prepared. The stacked solder bumps 13 are interposed between the printed wiring substrate 11 and the component 12. In this case, the upper solder bumps 13a among the stacked solder bumps 13 may be formed on the component 12, while the lower solder bumps 13b may be formed on the interposer substrate 74. The interposer substrate 74 is also previously prepared. Standoff members 75 have been fixed on the interposer substrate 74. The standoff members 75 are designed to stand on the upper and lower surfaces of the interposer substrate 74. The thus prepared interposer substrate 74 and the component 12 are sequentially placed on the printed wiring substrate 11. During a reflowing process, the component 12 and the interposer substrate 74 are urged against the printed wiring substrate 11 by their own weight and an additional urging force 77. The solder bumps 13a, 13b are allowed to melt under a pressurized condition. The printed wiring substrate 11 is thereafter cooled down. The standoff members 75 serve to keep a predetermined space between the printed wiring substrate 11 and the component 12, so that the solder bumps 13a, 13b can be prevented from excessively squashing in a pressurized condition. A pressure during a reflowing process enables leveling the height of the final solder bumps 13a, 13b, regulated by the height of the standoff members 75, on the identical level even if an irregularity can be found in the height of the solder bumps 13a, 13b on the identical level before reflowing. The respective solder bumps 13a, 13b reliably achieve a bonding between the component 12 and interposer substrate 74 as well as between the interposer substrate 74 and the printed wiring substrate 11.

Figure 27:
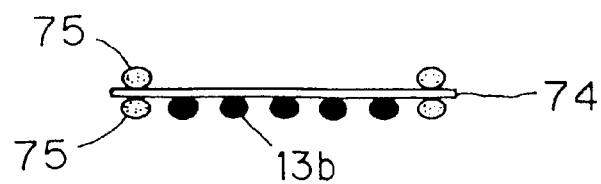
FIG. 27 is a side view illustrating an example of an interposer substrate according to the eleventh embodiment.
Figure 28:
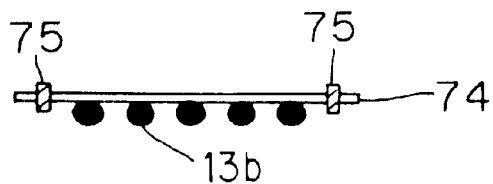
FIG. 28 is a side view illustrating another example of an interposer substrate according to the eleventh embodiment.
Figure 29:
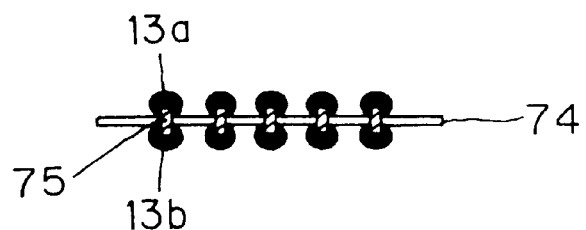
FIG. 29 is a side view illustrating further example of an interposer substrate according to the eleventh embodiment.
Figure 30:
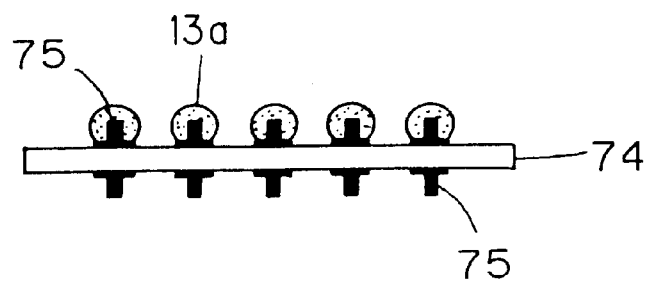
FIG. 30 is a side view illustrating still further example of an interposer substrate according to the eleventh embodiment.
Figure 31:
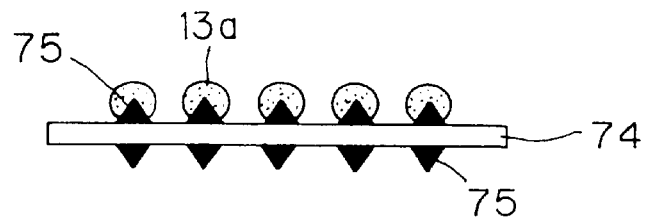
FIG. 31 is a side view illustrating still further example of an interposer substrate according to the eleventh embodiment.

As shown in FIG. 27, the standoff member 75 may be a solder bump of a higher melting point located at corners of the area receiving the solder bumps 13b. The solder bump of a higher melting point is refrained from melting during the reflowing process of the solder bumps 13a, 13b, so that the standoff members 75 is allowed to keep its shape and height during the reflowing. In place of the solder bump, the standoff member 75 may be a pin, as shown in FIG. 28. In addition, the standoff members 75 are not necessarily located outside the area receiving the solder bumps 13b. As shown in FIG. 29, the standoff member 75 can be embedded in a via connecting the upper and lower solder bumps 13a, 13b to each other. Furthermore, the standoff member 75 may be formed as a protrusion integral to the conductive electrode pads, as shown in FIGS. 30 and 31.

Figure 32:
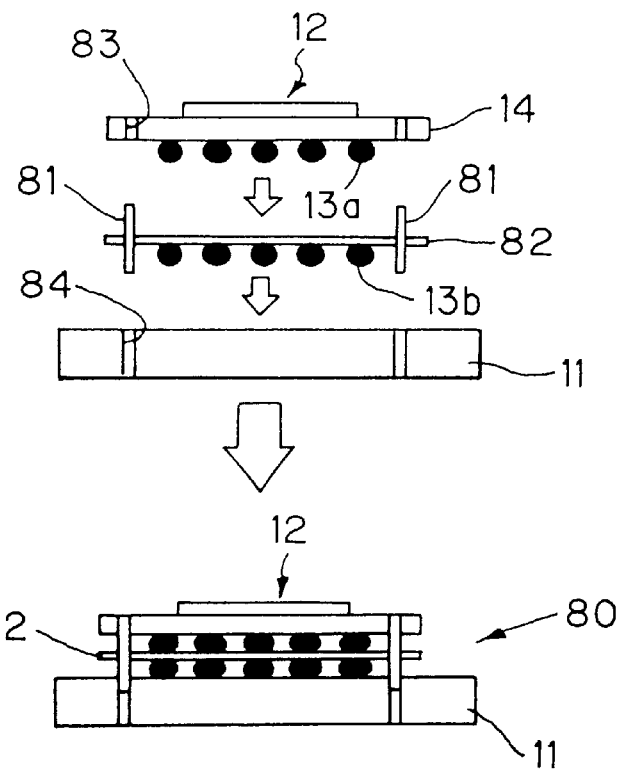
FIG. 32 is a side view schematically illustrating the structure of a multileveled printed circuit board unit comprising an interposer substrate according to a twelfth embodiment of the present invention, and a method of producing the same.

FIG. 32 illustrates a multileveled printed circuit board unit 80 employing an interposer or relay substrate according to a twelfth embodiment of the present invention. The printed circuit board unit 80 includes guide members 81 located on the interposer substrate 82 at a predetermined position for adjustment of a relative position between the printed wiring substrate 11 and the component 12. The guide member 81 is received in a guide bore 83 defined in the component 12 and a guide bore 84 defined in the printed wiring substrate 11. The guide members 81 serve to prevent a displacement or slippage of the component 12 relative to the printed wiring substrate 11 even when the solder bumps 13a, 13b are caused to melt during a reflowing process. The solder bumps 13a can reliably be bonded to the corresponding electrode pads on the interposer substrate 82, respectively, while the solder bumps 13b can reliably be bonded to the corresponding electrode pads on the printed wiring substrate 11.

Figure 33:
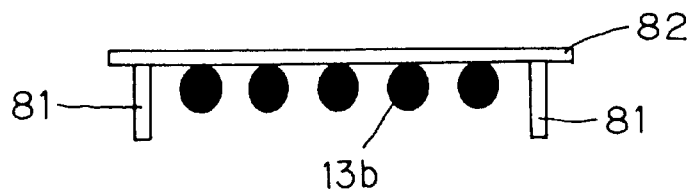
FIG. 33 is a side view illustrating another example of an interposer substrate according to the twelfth embodiment.
Figure 34:
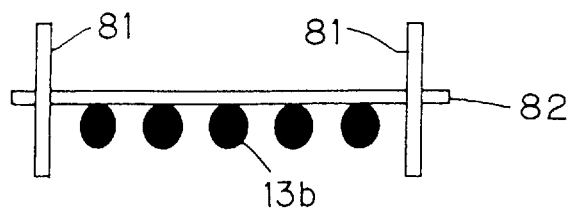
FIG. 34 is a side view illustrating further example of an interposer substrate according to the twelfth embodiment.
Figure 35:
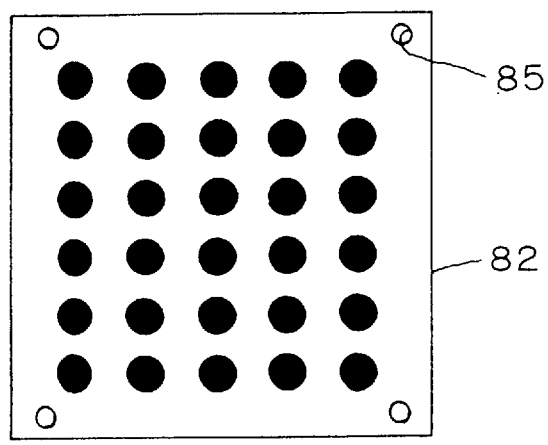
FIG. 35 is a plan view illustrating still further example of an interposer substrate according to the twelfth embodiment.
Figure 36:
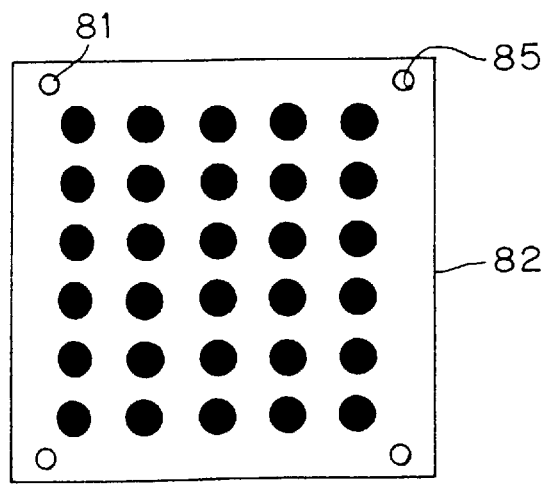
FIG. 36 is a plan view illustrating still further example of an interposer substrate according to the twelfth embodiment.

As shown in FIG. 33, the guide member 81 may be allowed to protrude from one of the upper and lower surfaces of the interposer substrate 82. Alternatively, the guide member 81 may protrude from both the upper and lower surfaces of the interposer substrate 82, as shown in FIG. 34. When a plurality of interposer substrates 82 are interposed between the printed wiring substrate 11 and the component 12, the interposer substrate 82 solely defining the guide bores 85 can be employed, as shown in FIG. 35. Otherwise, the guide members 81 and the guide bores 85 may be disposed in every interposer substrate 82, as shown in FIG. 36.

What is claimed is:

1. An interposer for a multileveled printed circuit board unit, comprising:

an interposer substrate having first and second surfaces to be interposed between a printed wiring substrate and a mounted component;

first conductive pads stationarily fixed on the first surface;

first conductive bumps adhered to the first conductive pads based on diffusion bonding;

second conductive pads stationarily fixed on the second surface;

second conductive bumps adhered to the second conductive pads based on diffusion bonding, said second conductive bumps being made of an element or elements different from that of the first conductive bumps, wherein said first and second conductive bumps have a melting point lower than that of a resin material for the printed wiring substrate.

2. The interposer according to claim 1, wherein said first conductive bumps are made from a leadless solder.

3. A multileveled printed circuit board unit comprising:

a printed wiring substrate made of a resin material;

a mounted component received above the printed wiring substrate, said mounted component having a ceramic substrate;

an interposer substrate having first and second surfaces and disposed in a space between the printed wiring substrate and the mounted component;

first conductive pads stationarily fixed on the first surface;

first conductive bumps adhered to the first conductive pads based on diffusion bonding;

second conductive pads stationarily fixed on the second surface; and second conductive bumps adhered to the second conductive pads based on diffusion bonding, said second conductive bumps being made of an element or elements different from that of the first conductive bumps.

4. The multileveled printed circuit board unit according to claim 3, wherein said first conductive bumps are made from a leadless solder.

* * * * *